US006765802B1

(12) United States Patent
Ridley

(10) Patent No.: US 6,765,802 B1
(45) Date of Patent: Jul. 20, 2004

(54) AUDIO SOUND QUALITY ENHANCEMENT APPARATUS

(75) Inventor: Ray B. Ridley, Roswell, GA (US)

(73) Assignee: Ridley Engineering, Inc., Roswell, GA (US)

(*) Notice: Subject to any disclaimer, the term of this patent is extended or adjusted under 35 U.S.C. 154(b) by 490 days.

(21) Appl. No.: 09/698,450

(22) Filed: Oct. 27, 2000

(51) Int. Cl.[7] ............................ H05K 7/10; H05K 7/12
(52) U.S. Cl. ....................................... 361/767; 361/760
(58) Field of Search ................................ 361/760, 767; 330/256, 259; 381/56, 111, 120

(56) References Cited

U.S. PATENT DOCUMENTS

| | | | | | |
|---|---|---|---|---|---|
| 3,258,606 | A | * | 6/1966 | Meadoes | 327/512 |
| 3,383,614 | A | * | 5/1968 | Emmons et al. | 330/256 |
| 3,393,328 | A | * | 7/1968 | Meadows et al. | 327/512 |
| 3,882,728 | A | * | 5/1975 | Wittlinger | 374/112 |
| 3,965,437 | A | * | 6/1976 | Kim | 330/299 |
| 4,268,887 | A | * | 5/1981 | Ghiringelli et al. | 361/93.8 |
| 4,320,349 | A | | 3/1982 | Freers et al. | 330/66 |
| 4,403,199 | A | | 9/1983 | Blackmer | 330/278 |
| 4,625,328 | A | | 11/1986 | Freadman | 381/111 |
| 4,885,477 | A | | 12/1989 | Bird et al. | 307/296.8 |
| 4,920,405 | A | * | 4/1990 | Itoh et al. | 257/687 |
| 5,063,342 | A | | 11/1991 | Hughes et al. | 323/315 |
| 5,331,291 | A | | 7/1994 | D'Agostino et al. | 330/289 |
| 5,483,199 | A | | 1/1996 | Knudsen | 330/289 |
| 5,563,760 | A | * | 10/1996 | Lowis et al. | 361/103 |
| 5,592,363 | A | | 1/1997 | Atarashi et al. | 361/689 |
| 5,635,871 | A | * | 6/1997 | Cavigelli | 330/107 |
| 5,635,874 | A | | 6/1997 | Perrot | 330/259 |
| 5,770,973 | A | | 6/1998 | Fujisawa et al. | 330/289 |
| 5,815,040 | A | | 9/1998 | Barbetta | 330/264 |
| 5,869,892 | A | | 2/1999 | Ohtsubo et al. | 257/713 |
| 5,873,053 | A | | 2/1999 | Pricer et al. | 702/130 |
| 5,898,908 | A | | 4/1999 | Griffin et al. | 455/127 |
| 5,977,832 | A | * | 11/1999 | Satyanarayana et al. | 330/289 |
| 5,986,508 | A | | 11/1999 | Nevin | 330/289 |
| 6,018,270 | A | | 1/2000 | Stuebing et al. | 330/278 |
| 6,100,199 | A | | 8/2000 | Joshi et al. | 438/694 |
| 6,100,759 | A | | 8/2000 | Sirna et al. | 330/252 |
| 6,147,565 | A | * | 11/2000 | Satoh et al. | 331/70 |
| 6,433,309 | B2 | * | 8/2002 | Hashimoto et al. | 219/210 |

FOREIGN PATENT DOCUMENTS

| | | | |
|---|---|---|---|
| JP | 1-255261 | 10/1989 | H01L/27/04 |
| JP | 7-176772 | 7/1995 | H01L/29/88 |
| JP | 11-312770 | 11/1999 | H01L/23/40 |

* cited by examiner

*Primary Examiner*—Kammie Cuneo
*Assistant Examiner*—Tuan Dinh
(74) *Attorney, Agent, or Firm*—Hayes Soloway PC

(57) ABSTRACT

An audio sound quality enhancer which provides a transparent sound quality, using solid-state devices, which has previously been available only in vacuum tube audio systems. The invention comprises at least one solid-state component in the audio signal path of an audio circuit, and at least one heat source configured to heat the solid-state components. The invention increases the sound quality of solid-state audio systems by increasing the temperature of the semiconductor components involved in sound production. By intentionally heating the semiconductor components of an audio system above standard operating temperatures, the invention delivers sound quality levels normally only associated with vacuum tube sound systems.

21 Claims, 7 Drawing Sheets

FLOW DIAGRAM FOR THE METHOD OF SOUND QUALITY ENHANCEMENT (SQE)

AUDIO SOUND QUALITY ENHANCEMENT APPARATUS

BACKGROUND OF THE INVENTION

1. Field of the Invention

The present invention pertains generally to devices, assemblies and systems for sound reproduction and/or recording, and more particularly to an audio sound apparatus which provides enhanced sound quality by maintaining one or more solid-state components at elevated temperature during sound reproduction.

2. Description of the Background Art

Before the mid-1960s, vacuum tubes were the technology used for audio amplification. Various tubes were developed for radio, television, radar, RF power, audio and specialized applications. Over several decades of design, with a limited selection of tubes, a few standard designs for audio amplification evolved. Tube power amplifiers consisted typically of a preamplifier stage to increase the voltage signal, and an output stage to provide power amplification. The output impedance of a tube amplifier without any feedback or transformers in the circuit is limited by the characteristics of tube technology to tens or hundreds of ohms. Output transformers are usually used to lower this output impedance to provide good power transfer to low impedance loads, such as loudspeakers.

The semiconductor (transistor) revolution provided immediate advantages to the power amplifier industry over existing vacuum tube systems. Semiconductor systems are small, reliable, and they dissipate far less heat than vacuum tubes. Furthermore, transistors can be low voltage devices with low inherent impedances that eliminate the need for audio output transformers. This greatly reduces potential cost, and eliminates the distortion effects and bandwidth limitations of the transformer. The majority of systems and devices which at one-time relied on vacuum tubes have been converted to semiconductors, leaving only a few vacuum tube types manufactured and in regular use, predominantly in the high-end audio field.

Despite 35 years of transistor technology, and the apparently simple task of amplifier design, there is no standardization within the industry. Audio experts have come to recognize that all audio devices have inherent distortions to which the human ear is remarkably sensitive. The conventional measures of total harmonic distortion (THD) and frequency response have proven to be inadequate in comparing one amplifier to another.

Vacuum tube systems, with their obvious drawbacks of inefficiency, heat, unreliability, size, and high impedance, still command a strong presence in the high-end audio industry. Many listeners find vacuum tube amplifiers to be more "transparent" than semiconductor systems, meaning the vacuum tube systems are less prone to the type of semiconductor distortions that change the original characteristics of the music signal. The survival of the vacuum tube amplifier defies the logic of conventional engineering measurements to this day.

For the past two decades, designers of high-end audio equipment have focused on the task of trying to get solid-state (transistor) amplifiers to sound like vacuum tube amplifiers. These efforts have usually focused on the measurable distortion characteristics found in many of the older vacuum tube amplifiers. The human ear finds even-order harmonics to be inherently of a musical nature, and some favored tube amplifiers are rich in these harmonics. Despite these efforts, no designer has yet succeeded in duplicating the quality of sound generated by tube amplifiers, as evidenced by the wide variety of designs and systems that are to be found in the current market, and the continued survival of vacuum-tube products. The high-end audio music market has not shifted to one type of transistor circuitry as the best design.

The main focus of research for the audio industry has been directed toward the circuitry. Presently, most high-end manufacturers of solid-state amplifiers recommend that their equipment should be "warmed up" before critical listening, but none of the makers have actually demonstrated, or even realized, that the sound quality is directly related to the thermal heating of solid-state components. The recommendation to "warm up" an audio system may originate from the classical vacuum tube systems in which "warm-up" was necessary for operation. Most manufacturers need to keep the external case temperatures low for safety and reliability of audio appliances, and strive to keep the semiconductors below 60° C.

Class A amplifiers have become popular in recent years due to their enhanced sound quality. The Class A amplifiers are designed for high output-device currents which improve linearity since the devices are always conducting. In addition to increasing measured linearity, Class A amplifiers also elevate temperatures of the output devices, though this is not the stated purpose of the increased current. The consensus is that the higher the bias currents, as in the class A amplifiers, the better the sound, since the circuit becomes more linear. As the current is increased in the output stage to increase this linearity, every effort is made to keep the output device temperature low with large heatsinks. Despite these improvements, they have not enabled solid-state audio systems to obtain the same "transparency" found in vacuum tube systems. Such Class A amplifiers fail to achieve this goal because they do not raise the temperature of the output devices sufficiently, and make no attempt to raise the temperature of the other semiconductor devices in the amplifier, such as those found in the preamplifier stage.

Some of the best available amplifiers have become passive heat managers. They are provided in very large packages that do maintain an elevated temperature. Present amplifiers typically maintain the external heatsink temperature at no more than 60° C., and the junction temperature at no more than approximately 70° C. The external heatsink temperature must stay low for safety.

A few amplifiers contain thermal monitoring or thermal control devices to determine the temperature of output devices. These temperature monitoring devices are utilized to ensure that the components do not overheat and therefore are believed to contribute to system reliability. Other thermal control devices are designed to compensate for varying bias current caused by fluctuating temperature to maintain the signal gain relatively constant.

The present trend in the audio industry is to restrict temperatures of power devices. External heatsinks are restricted to about 65° C. Celsius or lower in order to keep the product safe to touch. Low thermal impedances are maintained to keep the output devices as close to this temperature as possible. Inside the case of amplifiers the temperature is maintained relatively low to ensure long life of components such as capacitors, which deteriorate with increased heat. Presently, no one in the audio field has directly addressed the thermal aspect of sound quality enhancement.

There is accordingly a need for an audio system that is capable of obtaining the transparent sound quality previously found only in vacuum tube systems, while maintaining reliability. The present invention satisfies this need, as well as others, and generally overcomes the deficiencies in the background art.

SUMMARY OF INVENTION

The invention is an audio sound quality enhancer which provides a transparent sound quality, using solid-state devices, which was previously available only in vacuum tube audio systems. In its most general terms, the invention comprises at least one solid-state component in the audio circuit signal path, and at least one heat source configured to heat the solid-state component or components. The invention increases the sound quality of solid-state audio systems by increasing the temperature of the semiconductor components involved in sound production. By intentionally heating the semiconductor components of an audio system above standard operating temperatures, the invention delivers sound quality levels normally only associated with vacuum tube sound systems. This invention provides a new class of solid-state semiconductor audio playing and recording components wherein every device in the audio path is deliberately heated to much higher temperatures, while maintaining safe external temperatures and full reliability on other components which are sensitive to elevated temperatures.

The invention further describes an audio device comprised of solid-state semiconductors where all of the semiconductors in the audio amplifying path are actively heated to a junction temperature of at least 60° C., more preferably at least 80° C, and even more preferably in excess of 100° C. The maximum temperature may be substantially above 100° C. In fact, temperatures of at least 125° C., at least 150° C., and at least 175° C. are contemplated by this invention. The semiconductor devices which are heated include small-signal devices in addition to high-power amplifying devices. Operation below the preferred temperature range results in deterioration in sound quality.

The heat source can comprise one or more thermal elements such as a conductive (or radiative) source placed in close proximity to the solid-state components. This heat source can be placed adjacent to the audio circuit board or can be an integral part of the board. Along with the differential amplifier, the output devices should also be allowed to run in excess of 80° C., much warmer than the industry standard. The invention also demonstrates that all of the low-power preamplifier devices should also be run at temperatures in excess of 80° C. to achieve the best performance possible. The inventor has completed experiments which indicate that raising the temperature above 100° C. continues to improve the sound quality.

An object of the invention is to provide an increase in the sound quality of an audio device by heating the semiconductor components of an audio circuit board by heating the complete circuit board. It is preferable to specifically heat only the audio semiconductor components with a conductive heat source in order to maintain reliability of components that cannot tolerate the increased temperature. The heat source may be mounted on the circuit board or externally located in proximity to the specific solid-state components to be heated for increased sound quality.

Another object of the invention is to provide a method of sound enhancement by heating semiconductor circuitry by applying a heat source in close proximity to circuit elements to perform the heating step.

Another object of the invention is to provide a method of sound enhancement by running sufficient power through an audio device such that it heats itself. The output power devices are suited for this. They naturally produce heat, and are in large, thermally efficient packages that manage the heat well. An improvement over current technology is to increase the thermal impedance to the heatsink to allow the devices themselves to become much hotter with the same dissipation, and maintain the same external temperature.

Another object of the invention is to provide a method of sound enhancement by using a heat source comprised of a heating element or another semiconductor, or have the circuit heat itself but control it by way of a thermal heat transfer feedback mechanism.

Another object of the invention is to provide a method of sound enhancement by heating the semiconductor elements in the audio path by utilizing internal bias currents and voltages as a heat source coupled with at least one heat transfer device to control semiconductor component temperatures within a desired range.

Another embodiment for the invention is a method of heating the semiconductor elements in the audio path using at least one additional element in the semiconductor package which does not carry audio signal as a heat source. This additional element is coupled with at least one heat transfer device to control semiconductor component temperature within a desired range.

Another object of the invention is to provide an increase in the sound quality of an audio device by using external heating elements such as resistors, coupled to heat transfer devices to control temperature within a desired range.

Another object of the invention is to provide an increase in the sound quality of an audio device by isolating the semiconductor components in the audio signal path and mount them on a separate circuit board to allow thermal management thereof.

Further objects and advantages of the invention will be brought out in the following portions of the specification, wherein the detailed description is for the purpose of fully disclosing the preferred embodiment of the invention without placing limitations thereon.

BRIEF DESCRIPTION OF THE DRAWINGS

The present invention will be more fully understood by reference to the following drawings, which are for illustrative purposes only.

DETAILED DESCRIPTION OF THE PREFERRED EMBODIMENTS

Referring more specifically to the drawings, for illustrative purposes the present invention is embodied in the apparatus and method shown generally in FIGS. 1 through 6. It will be appreciated that the apparatus may vary as to configuration and as to details of the parts, and that the method may vary as to details and the order of events, without departing from the basic concepts as disclosed herein. The invention is disclosed generally in terms of use with simple and representative audio circuits. However, it will be readily apparent to those skilled in the art that the invention may be applied to various devices and different circuit configurations wherein increased sound quality is beneficial.

Figure 1:
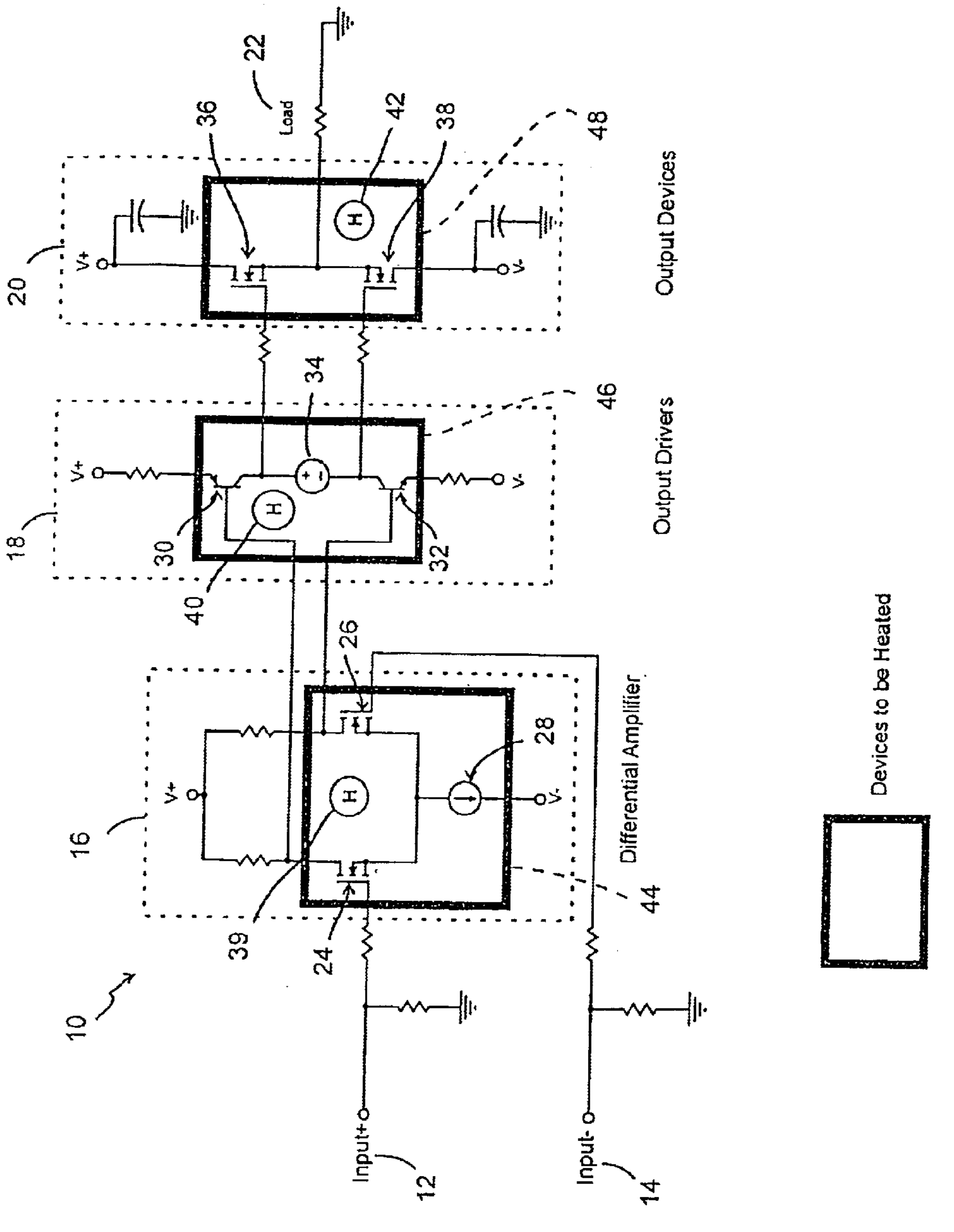
FIG. 1 is a schematic diagram of a simplified audio circuit showing selected circuit elements which are heated in accordance with the invention.

Referring now to FIG. 1, one presently preferred audio enhancement apparatus 10 in accordance with the invention is shown schematically. The apparatus 10 generally includes dual inputs 12, 14, a differential input or amplifier component 16 operatively coupled to inputs 12, 14, a phase splitter or output driver component 18 operatively coupled to differential amplifier 16, and a "push/pull" output device component 20 operatively coupled to the output driver component 18. One or more load devices 22, such as a speaker or like sound output device, are operatively coupled to the output device component 20. The components 16, 18, 20 define generally an audio signal path for the apparatus 10.

The apparatus 10 is shown schematically as a simple dual channel audio circuit. Differential amplifier component 16 includes dual transistors 24, 26 together with an associated current source 28. Output driver component 18 includes dual transistors 30, 32 together with an associated bias voltage source 34. Output device component 20 likewise includes dual transistors 36, 38. The apparatus 10 is also configured for a load 22.

The components 16, 18, 20 are generally embodied in solid-state devices which are separately packaged and which are mounted on a circuit board (not shown) in a conventional manner. The transistors 24–38 may comprise CMOS, NMOS or bipolar devices.

The apparatus 10 provides enhanced sound quality by heating selected components or portions of components of apparatus 10 for operation above ambient temperatures. In this regard, one or more heating elements are included with the invention, and are shown as a heating element 39 associated with differential amplifier component 16, heating element 40 associated with output In driver component 18, and heating element 42 associated with output device component 20. Heating elements 39, 40, 42 may comprise a variety of conventional conductive heating elements, and may be integral portions of solid-state components 16, 18, 20, or may be external thereto.

Heating elements 39, 40, 42 are preferably located and/or configured to selectively heat the semiconductor portions or elements of solid-state components 16, 18, 20. Thus, heating element 39 is positioned to heat a selected portion or region 44 of differential amplifier component 16 which includes transistors 24, 26 and current source 28. Heating element 40 is positioned to heat a selected region or portion 46 of output driver component 18 which contains transistors 30, 32, 34 (if solid state components are included therewith) and heating element 42 is positioned to selectively heat the portion or region 48 of output device component 20 which contains transistors 36, 38. Additional portions of solid-state components 16, 18, 20 may also be heated, although it is believed that sound quality enhancement is primarily achieved through heating of regions 44, 46, 48 as shown.

In the preferred embodiments, regions 44, 46, 48 of solid-state components 16, 18, 20 are heated to, and operated at, a temperature of at least 60° C. during sound generation or reproduction. More preferably, regions 44, 46, 48 are heated in excess of 80° C. Most preferably, regions 44, 46, 48 are heated in excess of 100° C. and are maintained within a temperature range of between approximately 100° C. and the temperature associated with the thermal damage threshold of the apparatus 10 or its individual components. Operation below the preferred temperature range or threshold results in deterioration in sound quality. It should be noted that additional portions of solid-state components 16, 18, 20 may also be heated, and the entire apparatus 10 may be heated to provide sound quality enhancement. More preferably, however, only selected portions 44, 46, 48 are heated for safety and/or reliability reasons.

The apparatus 10 shows merely one possible embodiment of an audio sound enhancer in accordance with the invention, and various other audio circuit configurations usable with the invention will suggest themselves to those skilled in the art. Thus, the particular circuit configuration of the apparatus 10 should be recognized as merely exemplary, and not limiting. Generally, the amplifying devices of the differential input stage of an audio circuit will provide improved sound quality when intentionally heated above ambient temperature. The current source may also benefit from applied heat thereto, depending on the configuration of the circuit used to generate the current source. Heating of the audio circuit output drivers also improves the overall sound quality delivered by an audio circuit. Heating of the semiconductor elements of the bias voltage source of an audio circuit may also benefit sound quality, depending on the configuration of the circuit used. The audio circuit output devices should also be heated for sound quality enhancement.

The apparatus 10 is shown as having three discrete heating elements 39, 40, 42 each associated with a separate solid-state component 16, 18, 20. In other embodiments of the invention, the solid-state components 16, 18, 20 may be suitably arranged on a circuit board such that a single heating element provides adequate heating of all solid-state components. In other embodiments of the invention, proper thermal arrangement of the various solid-state devices on the circuit board may allow the devices to sufficiently self-heat themselves. In these embodiments, the audio circuit components themselves will act as a heat source in accordance with the invention. Conventional amplifier designs do not achieve sufficient heating of solid-state components due to the low thermal impedance from the junction to the heatsink, which is typically kept at 65° C. or lower for safety and/or reliability reasons. One way to increase the junction temperature of the output devices is through increasing the thermal impedance to the heatsink with insulating materials, or the use of additional heating elements to maintain constant temperature, or a combination of both approaches.

Figure 2:
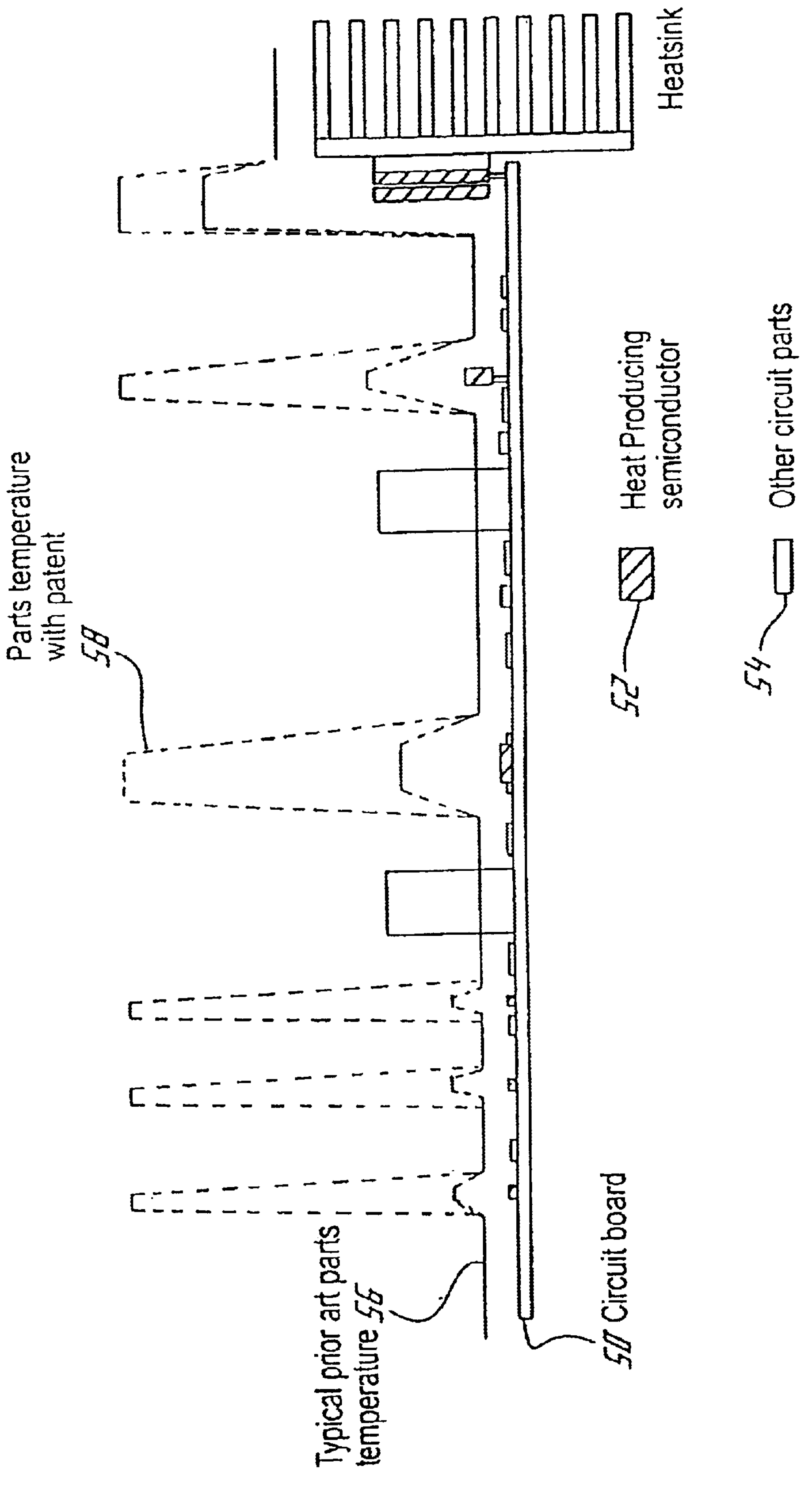
FIG. 2 is a schematic side view of an audio circuit board showing relative heat profiles (prior art versus invention) of solid-state components on the circuit board.

Referring to FIG. 2, there is shown a schematic side view of an audio circuit board 50 which illustrates one preferred heating arrangement in accordance with the invention. Circuit board 50 includes a plurality of heat producing semiconductor elements or components, shown collectively as reference number 52. Circuit board 50 also includes a plurality of circuit components that are not associated with heating, and which are collectively designated as reference number 54. Semiconductor elements 52 correspond generally to the semiconductor portions of components 16, 18, 20 shown in FIG. 1.

FIG. 2 shows a heat profile 56 (solid line) for the semiconductor components 52 mounted on circuit board 50 as occurs under normal industry operating temperatures. The heat profile 58 (dashed line) shows the heat profile of semiconductor elements 52 generated by intentionally heating of components 52 in accordance with the invention. Sound quality enhancement (SQE) is achieved when the temperature of the heat producing semiconductor components 52 are intentionally increased by at least one heat source (not shown). The heating element or elements may be mounted on board 50 proximate to semiconductor components.

Figure 3:
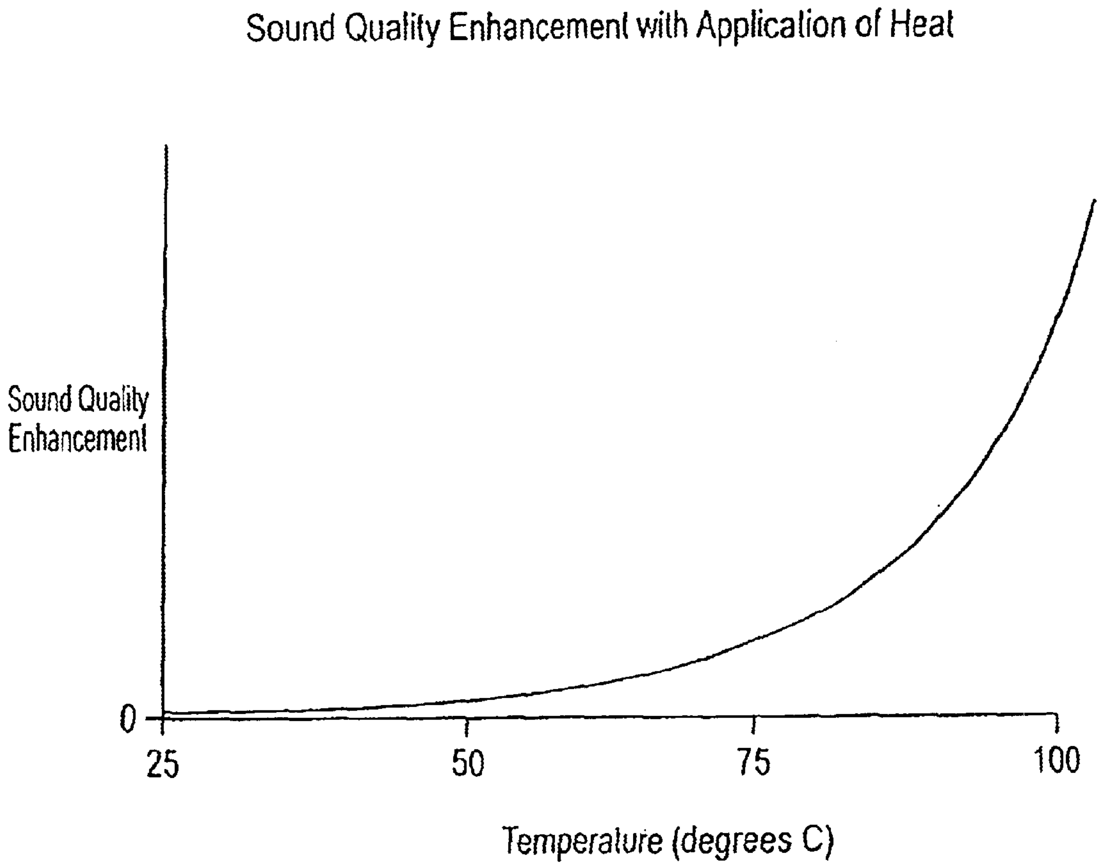
FIG. 3 is a graphical representation of relative sound quality enhancement versus solid-state component temperature.

Referring next to FIG. 3, there is shown a graphical representation of the relative sound quality enhancement versus temperature as provided by the invention. Several audiophiles evaluated the sound quality enhancement that was discemable at varying temperatures of the audio semiconductor components in an audio system wherein heating was provided in accordance with the invention. Below temperatures of 55° C. little change in sound quality was detected according to polling opinion of the audiophiles. A slight increase in sound quality was found within the temperature range of 55° C. to 75° C. Above 75° C., and particularly above 80° C., the sound quality increased further, up to 100° C. The sound enhancement achieved near 100° C. was thought to approach the transparency sound generated by tube systems. Additional experiments have indicated that temperatures above 100° C. result in even better sound enhancement qualities (data not shown). As indicated above, temperatures of at least 125° C., 150° C., and 175° C. are within the scope of this invention. The limiting factor of a particular transistor for such beating is the transistor's heat damage threshold. Otherwise, it is clear that heating to that threshold is contemplated and may, given the circuit at issue, be desirable. It should be noted that such heat damage thresholds for certain modern solid state components are above 125° C., 150° C., and 175° C. However, it is contemplated that such thresholds will continue to increase, and such increases, though possibly not presently available, are still within the scope of this invention. Presently, an upper temperature limit to the sound enhancement effect provided by the invention has not been determined, although it is recognized that an upper limit will be imposed by the material limitations of the components of the audio sound enhancement apparatus.

Figure 4A:
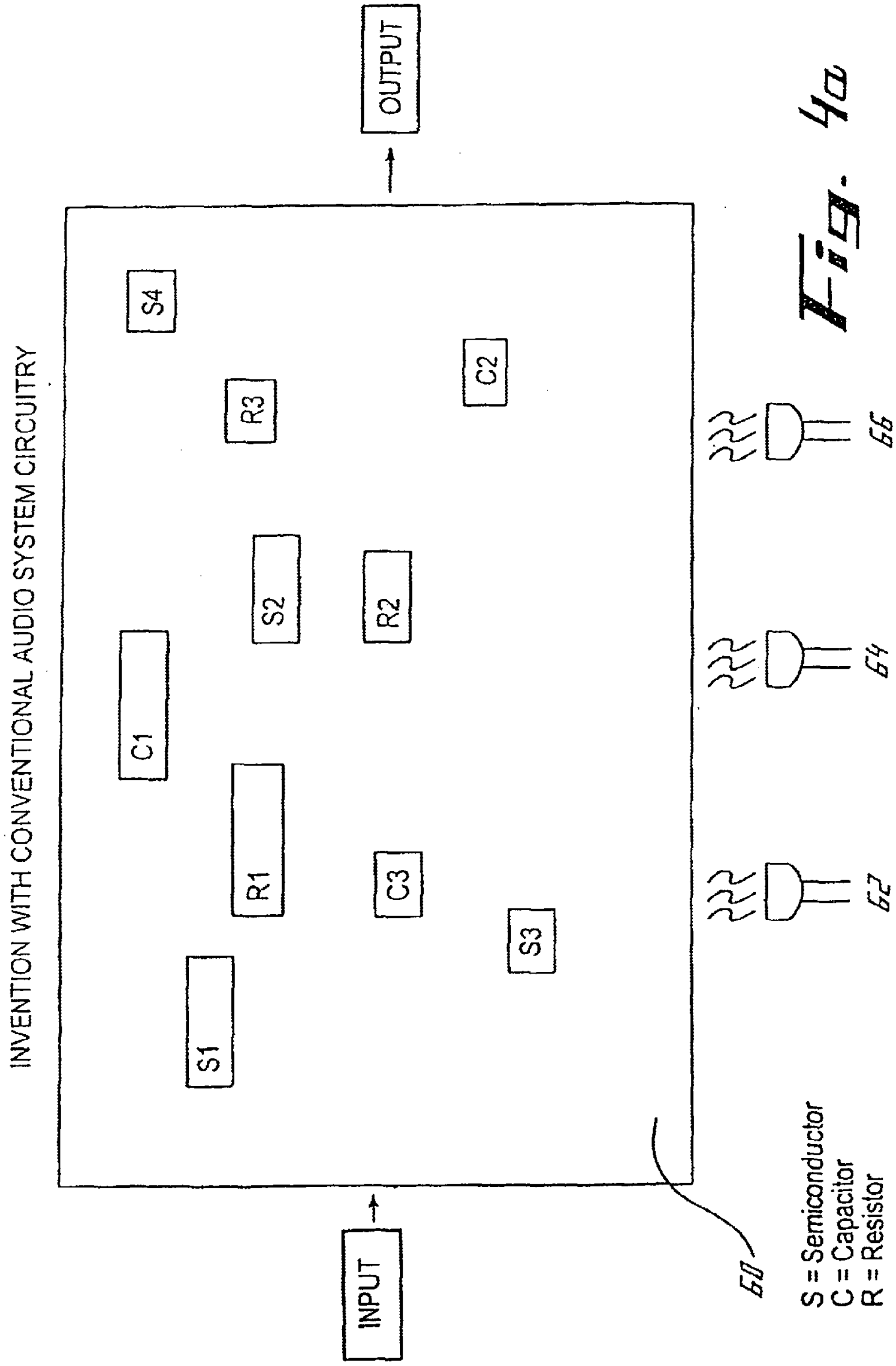
FIG. 4*a* and FIG. 4*b* are block diagrams which illustrate two different ways of configuring circuit elements and heating elements on an audio circuit board in accordance with the invention.
Figure 4B:
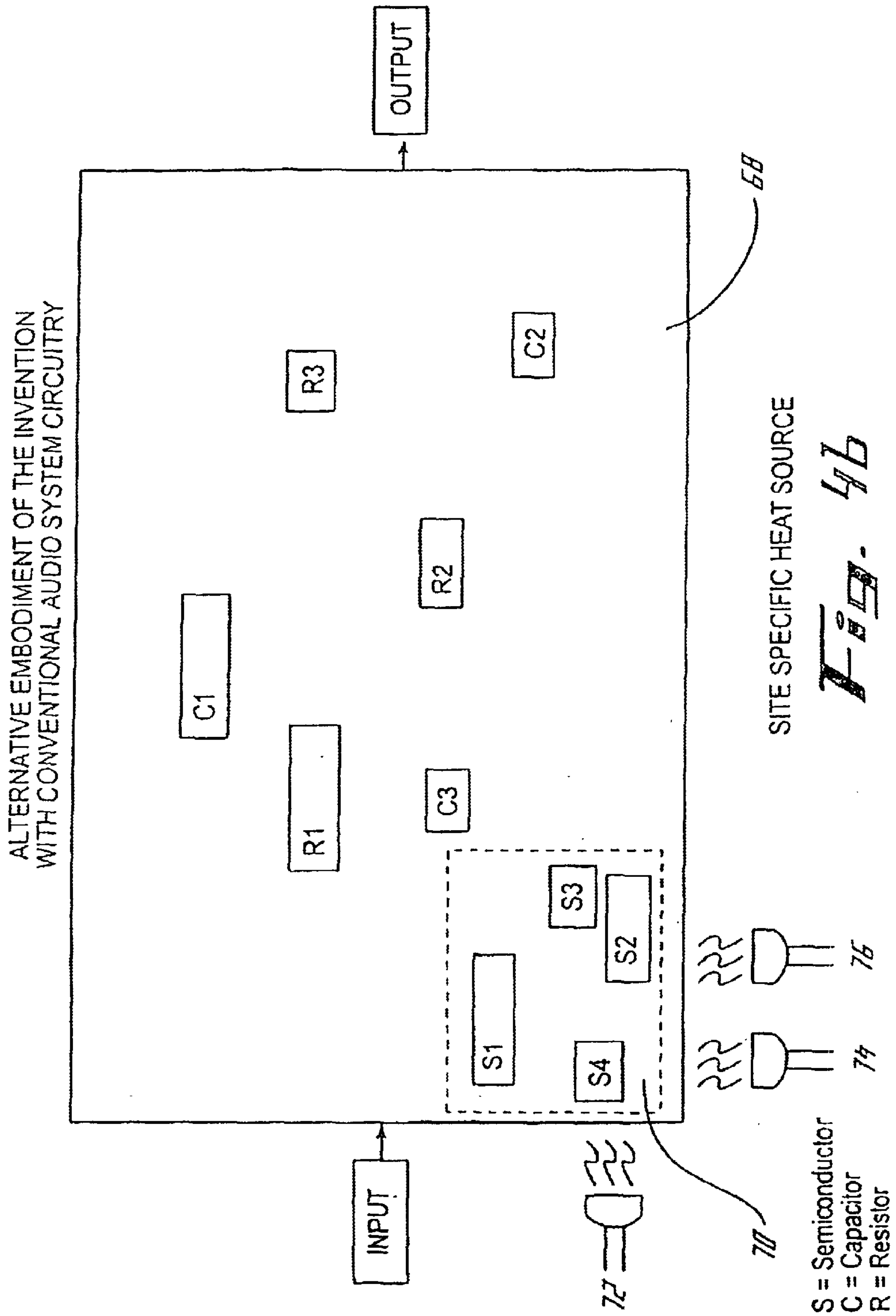

Referring to FIG. 4A and FIG. 4B, different arrangements of circuit elements and heating elements in accordance with the invention are shown. In FIG. 4A, an audio circuit board 60 includes a plurality of semiconductor components S1, S2, S3, S4, a plurality of capacitive elements C1, C2, C3, and a plurality of resistive elements R1, R2, R3, which are positioned on board 60 according conventional mounting considerations. In order to effectively heat the semiconductor elements S1, S2, S3, S4 in accordance with the invention, a plurality of heating elements 62, 64, 66 are positioned in association with board 60 such that semiconductor elements S1, S2, S3, S4 are maintained, during sound generation, at an operating temperature of at least 60° C., and more preferably in excess of 80° C., and most preferably in excess of 100° C. In this manner, an audio device of conventional configuration can be heated in accordance with the invention to provide sound quality enhancement. The heating elements 62, 64, 66 may be mounted on board 60 in selected locations to provide the desired heating, or may be external to board 60 and suitably positioned to provide the desired heating. The arrangement of FIG. 4A results generally in most or all portions of board 60 being equally heated. This equal heating ensures that the semiconductor elements S1, S2, S3, S4 are adequately heated.

In FIG. 4B, an audio circuit board 68 is shown again having a plurality of semiconductor components S1, S2, S3, S4, a plurality of capacitive elements C1, C2, C3, and a plurality of resistive elements R1, R2, R3. On the board 68, the semiconductor elements S1, S2, S3, S4 are selectively positioned proximate to one corner or region 70 of the board 68 so that effective heating of semiconductor elements S1, S2, S3, S4 in accordance with the invention can be more easily and effectively achieved by heat sources 72, 74, 76. The arrangement of FIG. 4B may also permit use of fewer heat sources than shown, or even a single heat source. Once again, heat sources 72, 74, 76 may be mounted on board 68, or may be external to board 68. Additionally, less external heating may be required in this arrangement due to collective thermal heat transfer resulting from co-location of the semiconductor components.

Figure 5:
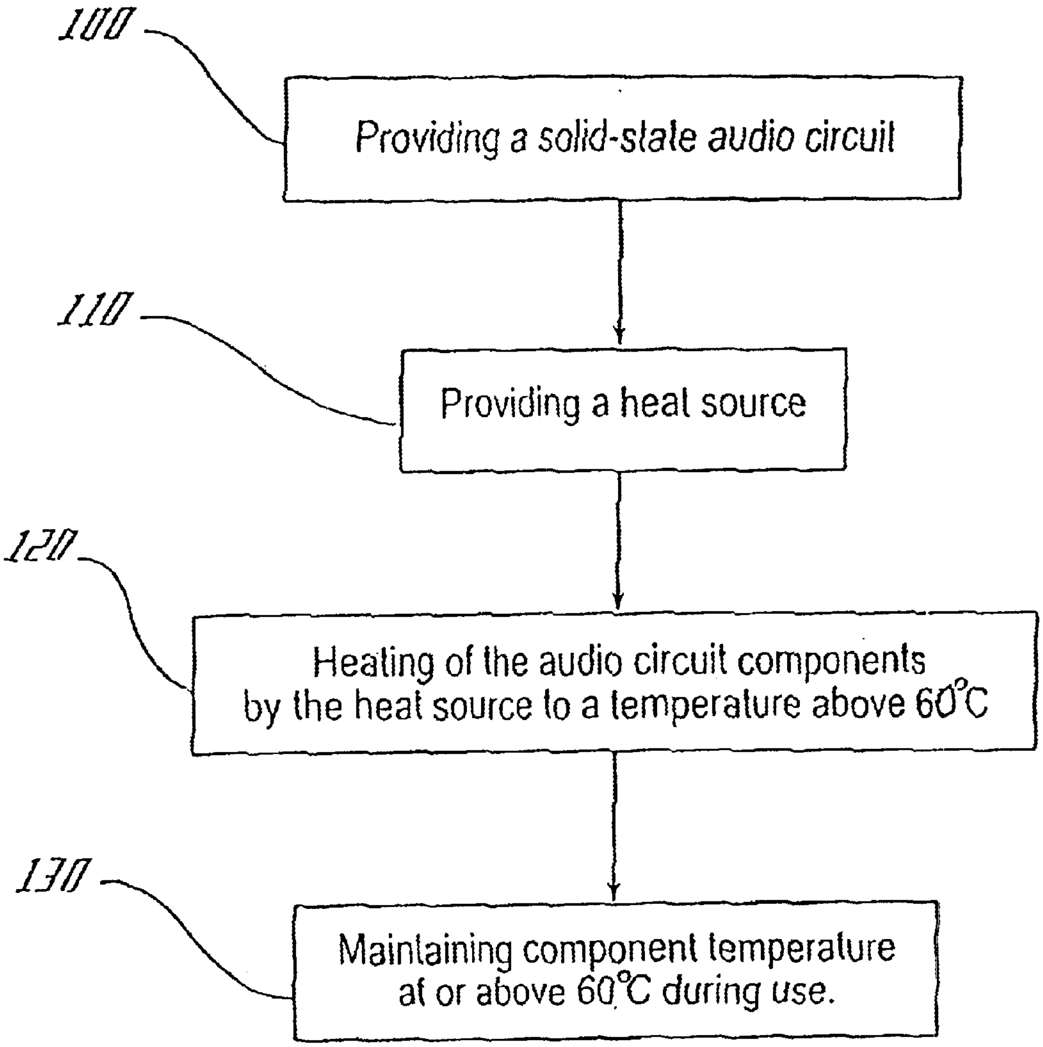
FIG. 5 is a flow chart illustrating an audio sound enhancement method in accordance with the present invention.

Referring now to FIG. 5, one preferred method for providing sound quality enhancement in accordance with the invention is shown. At event 100, a solidstate audio circuit is provided. The solid-state audio circuit will generally include one or more solid-state components or semiconductor elements which, upon heating as noted above, will result in sound quality enhancement. The audio circuit may comprise, for example, the apparatus 10 shown in FIG. 1.

At event 110, a heat source is provided to allow heating of the semiconductor components of the solid-state audio circuit. The heat source may comprise, for example, the heat sources 39, 40, 42 of the apparatus 10 of FIG. 1. The heat source is positioned to effectively heat the semiconductor elements or components of the audio circuit, as related above.

At event 120, the semiconductor circuit components of the audio circuit are heated to above 60° C. More preferably, the semiconductor components are heated in excess of 80° C. as described above, and most preferably in excess of 100° C. This is achieved by conduction of heat from the heat source to the semiconductor components.

At event 130, the temperature of the semiconductor components are maintained at or above 60° C., and more preferably above 80° C., and most preferably above 100° C. This is again achieved by conduction of heat from the heat source to the semiconductor components.

Figure 6:
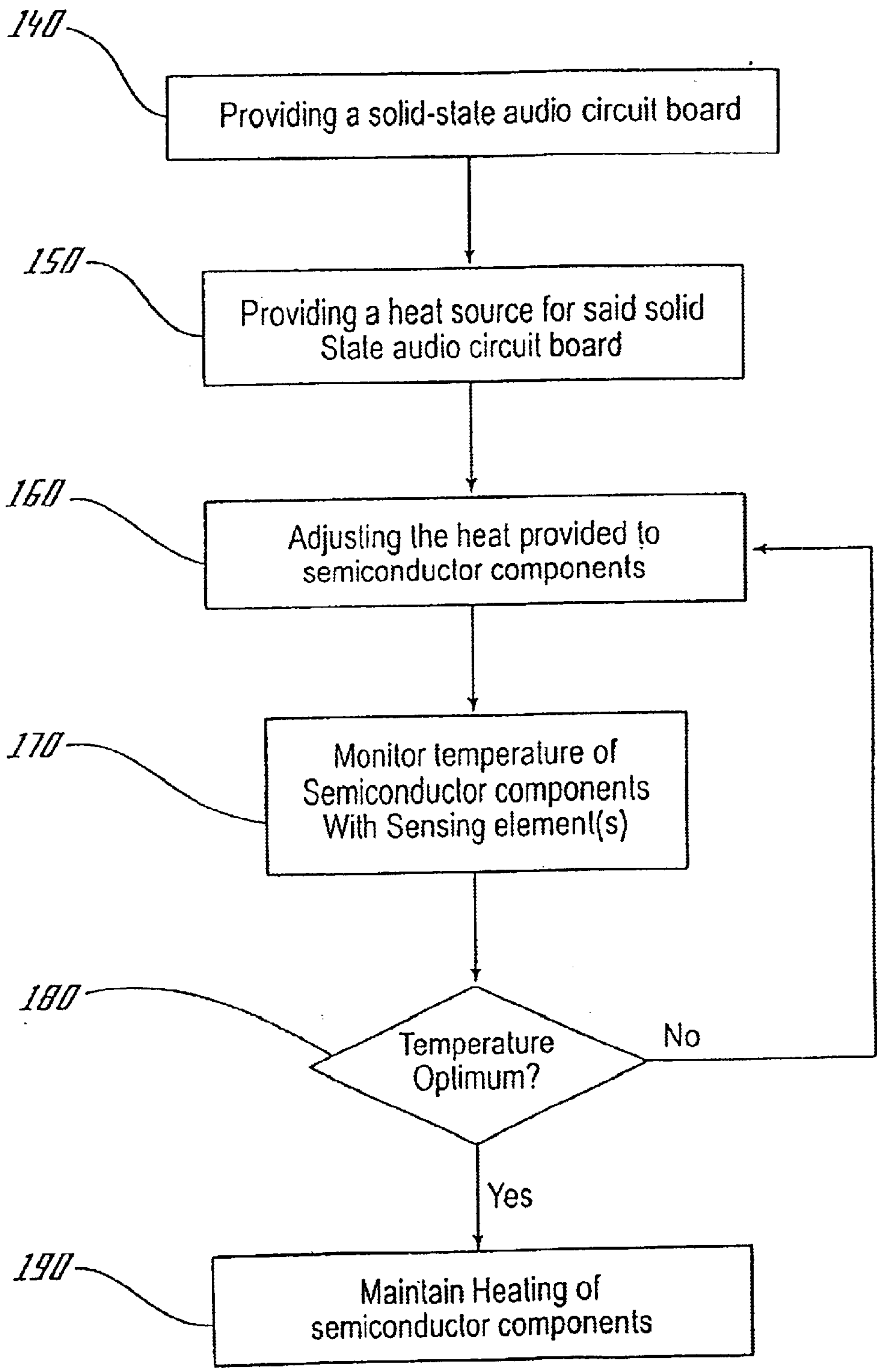
FIG. 6 is a flow chart illustrating an alternative audio sound enhancement method in accordance with the invention.

Referring now to FIG. 6, another method for providing sound quality enhancement in accordance with the invention is shown. At event 140, a solid-state audio circuit is provided in the manner described above. At event 150, a heat source is provided to allow heating of the semiconductor components of the solid-state audio circuit, as also described above.

At event 160, the temperature of the semiconductor components is adjusted by controlling the amount of heat provided to the semiconductor components. This event is generally carried out by selectively varying the power to the heating element or elements to control the amount of conductive heat provided to the semiconductor elements.

At event 170, the temperature of the semiconductor components is monitored or detected by one or more sensor or sensor elements which are positioned in association with the semiconductor components. In this regard, the apparatus 10, for example, may include a plurality of sensor elements positioned adjacent to regions 44, 46, 48 to monitor the temperature of the semiconductor elements in regions 44, 46, 48. A variety of conventional heat sensing devices may be used in this event.

At event 180, a query is made, by simple logic associated with the sensing of event 170, as to whether the temperature of semiconductor components detected in event 170 is optimal. Optimal temperature will generally be at least 60°

C., and more preferably at least 80° C., and most preferably above 100° C., as noted above. If the temperature of the semiconductor components detected in event 170 is non-optimal, event 160 is repeated. If the temperature is optimal, event 190 is carried out.

At event 190, the temperature of the semiconductor components, which was determined to be optimal in event 180, is maintained at the optimal temperature. Event 170 is generally carried out simultaneously with event 190, and if a non-optimal temperature is detected during the maintaining of temperature, event 160 will be carried out again to adjust the heat delivered to the semiconductor components.

The present invention demonstrates that superior sound quality can be obtained by elevating the temperature of audio semiconducting devices. Heat is the dominant factor in producing "transparent" sound from solid-state audio systems, and is a novel and unique aspect of sound production that the audio industry has heretofore failed to realize. The active heating of semiconductor devices as provided by the invention is to some extent contrary to the general industry trend to miniaturize and reduce cost, although it is possible to achieve these goals if thermal design is carefully considered.

The present invention is applicable to all audio playing or reproduction devices, as well as to audio devices associated with sound recording. Such devices include, without limitation: power amplifiers, preamplifiers, line stages, tape players and recorders, CD and DVD players and recorders, TV audio preamplifiers and power amplifiers, VCR audio preamplifiers and power amplifiers.

Accordingly, it will be seen that this invention provides increased sound quality enhancement to audio devices. Although the description above contains many specificities, these should not be construed as limiting the scope of the invention but as merely providing an illustration of the presently preferred embodiment of the invention. Thus the scope of this invention should be determined by the appended claims and their legal equivalents.

What is claimed is:

1. An audio sound quality enhancer comprising at least one solid-state component in an audio signal path; and at least one heat source configured to heat said at least one solid-state component.

2. The audio sound quality enhancer of claim 1 wherein said at least one solid-state component in said audio signal path is heated to a junction temperature of at least 60° C.

3. The audio sound quality enhancer of claim 1 wherein said at least one solid-state component in said audio signal path is heated to a junction temperature range of at least 80° C.

4. The audio sound quality enhancer of claim 1 wherein said at least one solid-state component in said audio signal path is heated to a junction temperature range of between approximately 80° C. and approximately 100° C.

5. The audio sound quality enhancer of claim 1 wherein said at least one solid-state component in said audio signal path is heated to a junction temperature of at least 100° C.

6. The audio sound quality enhancer of claim 1 wherein said at least one solid-state component in said audio signal path is heated to a junction temperature of at least 125° C.

7. The audio sound quality enhancer of claim 1 wherein said at least one solid-state component in said audio signal path is heated to a junction temperature of at least 150° C.

8. The audio sound quality enhancer of claim 1 wherein said at least one solid-state component in said audio signal path is heated to a junction temperature of at least 175° C.

9. The audio sound quality enhancer of claim 1 wherein said at least one solid-state component is mounted on a circuit board, and said at least one heat source is associated with said circuit board.

10. The audio sound quality enhancer of claim 1 wherein said at least one solid-state component comprises;

(a) a differential amplifier;

(b) an output driver; and (c) an output device.

11. The audio sound quality enhancer of claim 9 wherein said at least one heat source is adjacent to said circuit board and positioned to heat said at least one solid-state component.

12. The audio sound quality enhancer of claim 9 wherein said heat source is mounted on said circuit board and positioned to heat said at least one solid-state component.

13. The audio sound quality enhancer of claim 10, wherein said differential amplifier, said output driver, and said output device are selectively positioned on said circuit board such that they are proximate to said at least one heat source.

14. A method for generating audio sound comprising:

(a) providing an audio circuit having at least one solid-state component therein; and (b) heating said at least one solid-state component to at least 60° C.

15. The method of claim 14, wherein said heating of said at least one solid-state component is carried out to at least 80° C.

16. The method of claim 14, further comprising monitoring temperature of said at least one solid-state component.

17. The method of claim 15, wherein said heating of said at least one solid-state component is carried out to at least 100° C.

18. The method of claim 15, wherein said heating of said at least one solid-state component is carried out to at least 125° C.

19. The method of claim 15, wherein said heating of said at least one solid-state component is carried out to at least 150° C.

20. The method of claim 15, wherein said heating of said at least one solid-state component is carried out to at least 175° C.

21. The method of claim 16 further comprising adjusting said heating of said heating of at least one solid-state component when said temperature of said solid-state component falls below 60° C.

* * * * *